United States Patent
Chen et al.

(10) Patent No.: US 7,706,203 B2
(45) Date of Patent: Apr. 27, 2010

(54) MEMORY SYSTEM

(75) Inventors: Jui-Lung Chen, Hsinchu (TW); Yi-Hsun Chung, Miaoli County (TW); Chia-Chiuan Chang, Miaoli County (TW); Wei-Shung Chen, Hsinchu County (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 136 days.

(21) Appl. No.: 12/191,116

(22) Filed: Aug. 13, 2008

(65) Prior Publication Data

US 2009/0238023 A1 Sep. 24, 2009

(30) Foreign Application Priority Data

Mar. 21, 2008 (TW) .............................. 97110051 A

(51) Int. Cl.
*G11C 5/14* (2006.01)

(52) U.S. Cl. .............. 365/226; 365/189.09; 365/230.06

(58) Field of Classification Search ................. 365/226, 365/189.09, 189.01, 185.11, 185.23; 327/536, 327/537
See application file for complete search history.

(56) References Cited

U.S. PATENT DOCUMENTS

| | | | |
|---|---|---|---|
| 5,548,146 A * | 8/1996 | Kuroda et al. ................ | 257/321 |
| 6,635,934 B2 * | 10/2003 | Hidaka ........................ | 257/369 |
| 6,657,904 B2 * | 12/2003 | Higuchi .................. | 365/189.09 |
| 7,433,239 B2 * | 10/2008 | Nautiyal et al. ........ | 365/185.23 |

* cited by examiner

*Primary Examiner*—Gene N. Auduong
(74) *Attorney, Agent, or Firm*—Quintero Law Office

(57) ABSTRACT

A memory system is provided, comprising at least one memory unit and a source power supply circuit. Each memory unit is coupled between a source voltage and a ground voltage and accesses digital data according to a word line signal and a bit line signal. The source power supply circuit provides the source voltage to the memory units. When the memory unit is in a writing status, the source voltage is the first power voltage. When the memory unit is in a reading status, the source voltage is the second power voltage. The second power voltage equals to the first power voltage subtracted by a specific voltage for avoiding rewriting error.

12 Claims, 5 Drawing Sheets

MEMORY SYSTEM

CROSS REFERENCE TO RELATED APPLICATIONS

This application claims the full benefit and priority of Taiwan Patent Application Ser. No. 97110051, filed Mar. 21, 2008, and incorporates the entire contents of said application herein

BACKGROUND OF THE INVENTION

1. Field of the Invention

The invention relates to a memory unit with a bit line signal, and in particular relates to a memory unit receiving variable voltage supply to avoid data writing errors.

2. Description of the Related Art

FIG. 1 shows a conventional static random access memory (SRAM) 100 with five transistors 101, 102, 103, 104 and 105. A switch 101 is an NMOS transistor. The NMOS transistor 101 is turned on or turned off according to a word line signal WL to transmit a bit line signal BL to a memory unit 110. The memory 110 is formed by a latch circuit which comprises two inverters coupled cross over. The first inverter comprises an NMOS transistor 102 and a PMOS transistor 104. The second inverter comprises an NMOS transistor 103 and a PMOS transistor 105. Voltage levels of points B and C are opposite when storing digital data.

When the memory 100 is written by data 1, the voltage level of the bit line signal BL is pulled up to voltage Vdd and the word line signal WL turns on the NMOS transistor 101. Thus, the point B is at a high voltage level and the point C is at the low voltage level. When the memory 100 is written by data 0, the voltage level of the bit line signal BL is pulled down to voltage GND and the word line WL turns on the NMOS transistor 101. Thus, the point B is at a low voltage level and the point C is at a high voltage level.

When the memory storing data 1 is read, the bit line BL is precharged to voltage Vdd and then the word line WL turns on the NMOS transistor 101. Then, a memory system detects the voltage level of the bit line BL. Since the point B is at a high voltage level, the voltage level of the bit line BL will not be pulled down. Thus, the memory system detects the memory storing data 1.

When the memory storing data 0 is read, the bit line BL is precharged to voltage Vdd and then the word line WL turns on the NMOS transistor 101. Then, a memory system detects the voltage level of the bit line BL. Since the point C is at a high voltage level and the point B is at a low voltage level, the voltage level of the bit line BL will be pulled down. Thus, the memory system detects the memory storing data 0.

Because the memory comprises one bit line BL, when the memory is stored with data 1 (the point B is at high voltage level), the memory unit 110 can not be rewritten with data with a high voltage level. The conventional method is to adjust the beta ratio of transistors 102, 103, 104 and 105. However, the conventional method will cause instability with the memory unit 110. Thus, the objective of the invention is to solve the described problem.

BRIEF SUMMARY OF THE INVENTION

A detailed description is given in the following embodiments with reference to the accompanying drawings.

An embodiment of a memory system is provided. The memory system comprises at least one memory unit and a source power supply circuit. Each memory unit is coupled between a source voltage and a ground voltage and accesses digital data by using a word line signal and a bit line signal. The source power supply circuit provides the source voltage to the memory units. When the memory unit is in a writing status, the source voltage is the first power voltage. When the memory unit is in a reading status, the source voltage is the second power voltage. The second power voltage equals to the first power voltage subtracted by a specific voltage for avoiding rewriting error.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Since the memory 100 only comprises one bit line BL, when the memory unit 110 stores data as 1 (the point B is at high voltage level) and a high voltage level is used to rewrite data in the memory unit 110, a rewriting error will occur. A voltage difference between a source and a drain of an NMOS transistor is voltage $V_{TN}$. When the memory unit 110 is rewritten with data with a high voltage level, the bit line BL is voltage $V_{dd}$ and the voltage level of the point B is voltage $V_{dd}$-$V_{TN}$. The NMOS transistor 103 can not be turned on completely and the NMOS transistor 102 can not be turned off completely. Thus, the memory 100 can not be rewritten at the points B and C at the correct voltage levels, which causes the rewriting error when the memory unit 110 is rewritten with data with a high voltage level.

Figure 1:
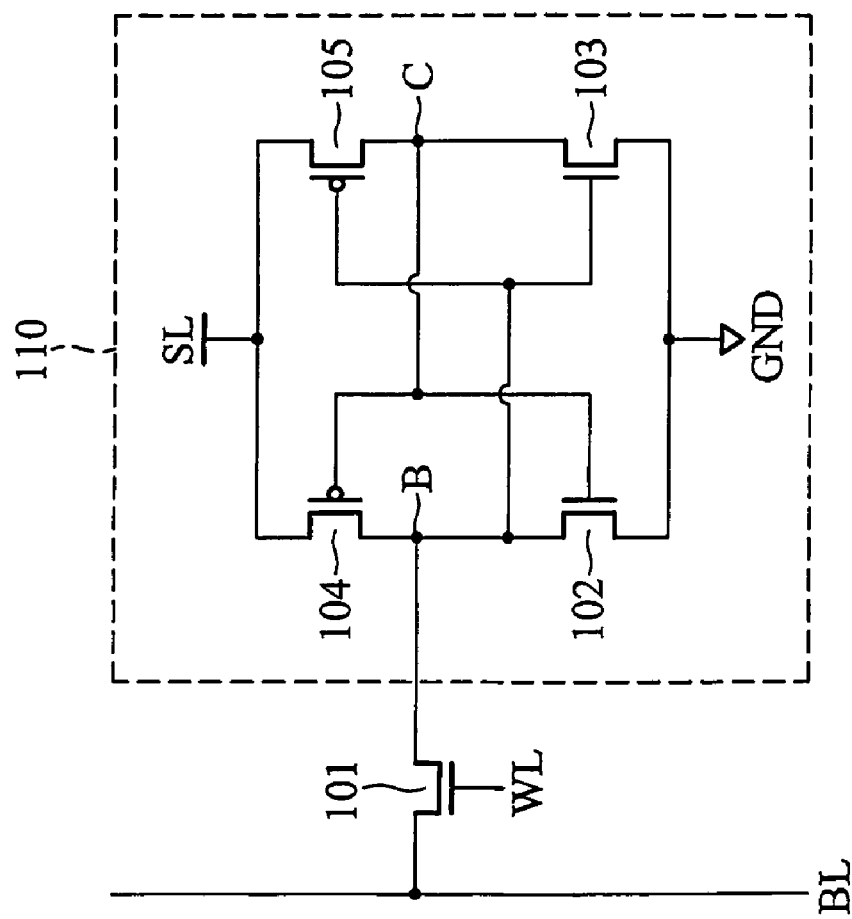
FIG. 1 shows a conventional static random access memory (SRAM) with five transistors.
Figure 2:
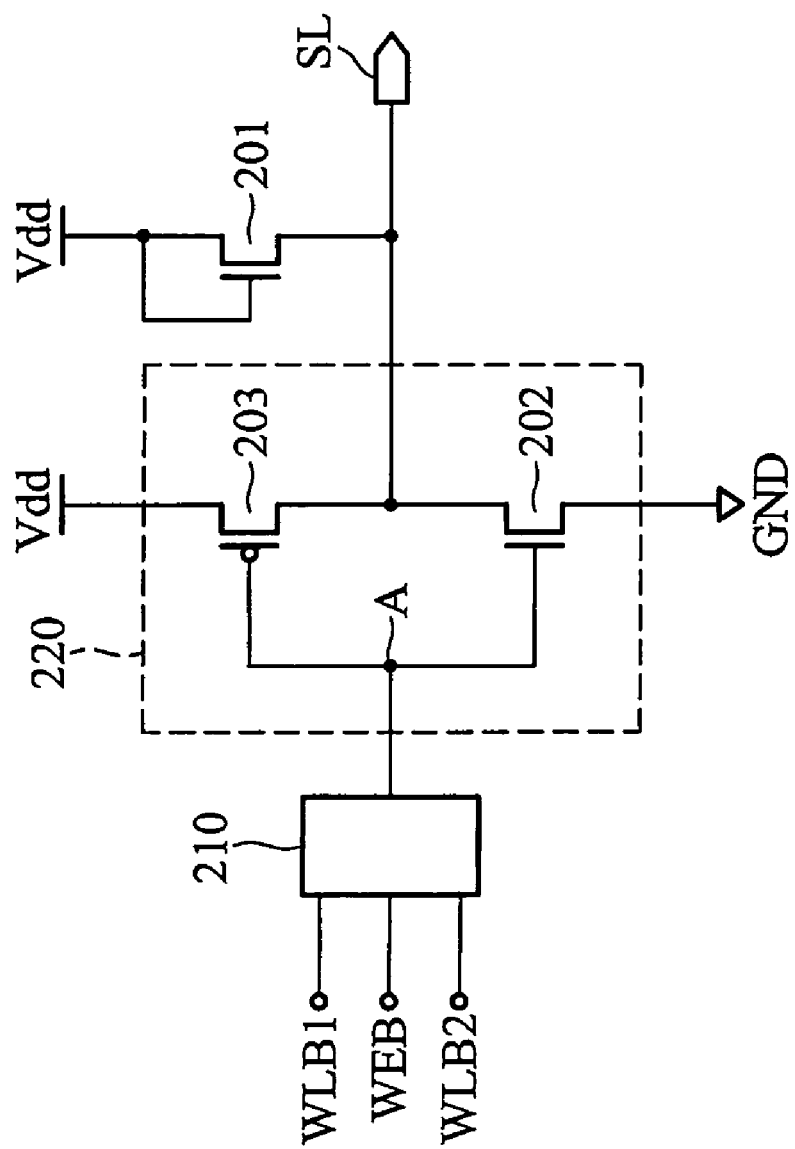
FIG. 2 shows a source power supply circuit according to an embodiment of the invention.

FIG. 2 shows a source power supply circuit 200 according to an embodiment of the invention. The source power supply circuit 200 can provide different source voltages SL to the memory unit 110. Referring to FIG. 1, when the memory unit 110 is in a writing status, the source power supply circuit 200 can provide voltage $V_{dd}$-$V_{TN}$. Thus, the NMOS transistor 103 of the memory unit 110 can be turned on completely to avoid the writing error. When the memory unit 110 is in a reading status, the source power supply circuit 200 can provide voltage $V_{dd}$ and the memory unit 110 can be read correctly by using the NMOS transistor 101 and the bit line BL.

The source power supply 200 determines the voltage levels of a point A and the source voltage SL according to the voltage levels of a write enable signal WEB, and word line signals WLB1 and WLB2. When the memory unit is in the writing status, the point A is at a high voltage level and the voltage level of the source voltage is $V_{dd}$-$V_{TN}$. When the memory unit 110 is in the reading status, the point A is at a low voltage level and the voltage level of the source voltage SL is voltage $V_{dd}$, as shown in Table 1.

TABLE 1

|  | WLB1 | WLB2 | WEB | A | SL |
|---|---|---|---|---|---|
| Read | X | X | 1 | GND | $V_{dd}$ |
| Write | 1 | 0 | 0 | $V_{dd}$ | $V_{dd}$-$V_{TN}$ |
| Write | 0 | 1 | 0 | $V_{dd}$ | $V_{dd}$-$V_{TN}$ |

The source power supply circuit 200 comprises a control circuit 210, a CMOS inverter 220 and an NMOS transistor 201. The control circuit 210 determines the voltage levels of the point A and the source voltage SL according to the voltage levels of a write enable signal WEB, and word line signals WLB1 and WLB2. Thus, the memory 110 can receive a lower voltage to avoid the writing error in the writing status. When the voltage level of the write enable signal WEB is at low voltage level (logic 0), the memory unit 110 is in the writing status. When the voltage level of the write enable signal WEB is at high voltage level (logic 1), the memory unit 110 is in the reading status. The word line signals WLB1 and WLB2 correspond to different columns or rows of the memory unit.

Figure 3:
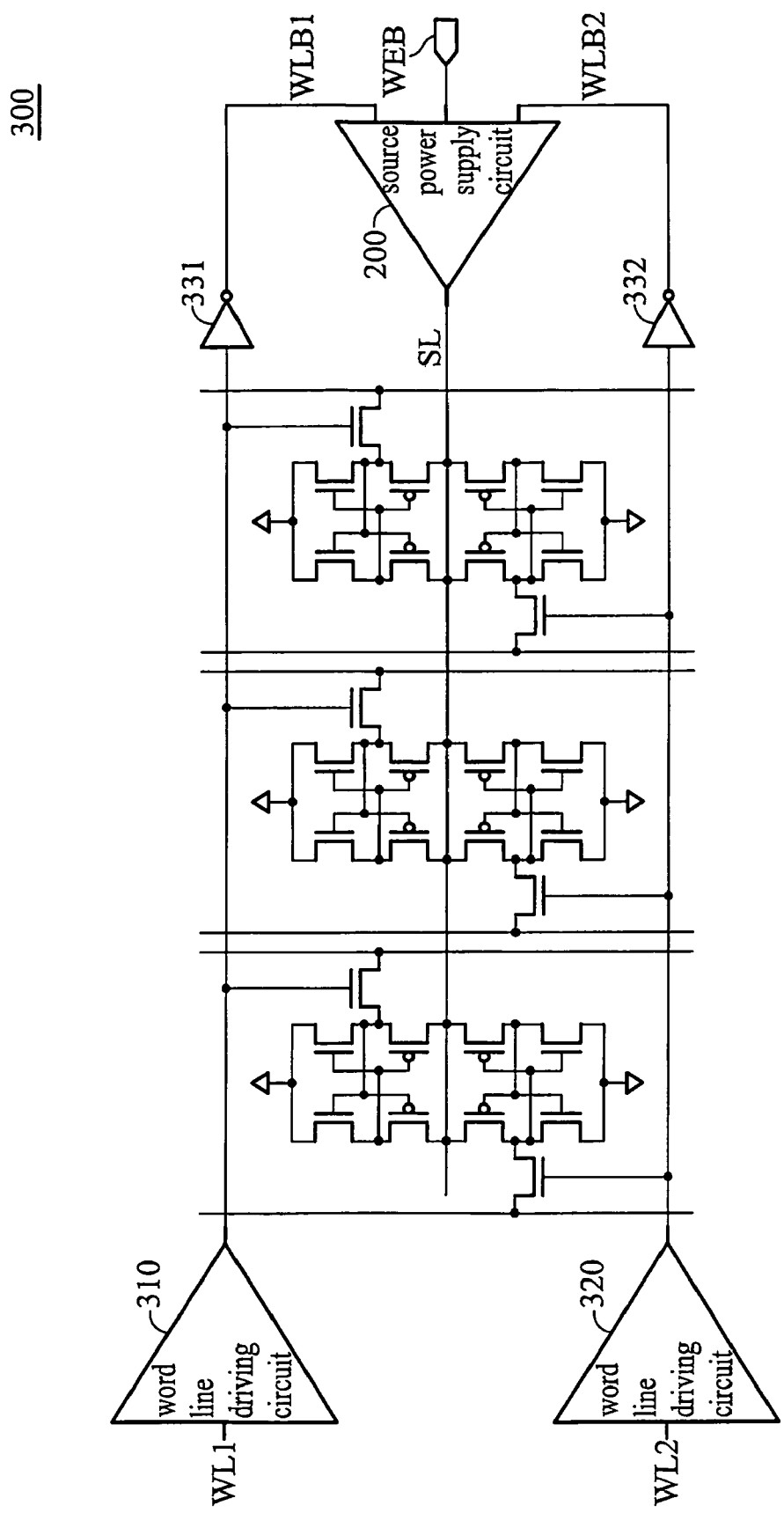
FIG. 3 shows a layout diagram of a memory system according to an embodiment of the invention.

FIG. 3 shows a layout diagram of a memory system 300 according to an embodiment of the invention. FIG. 3 only shows six transistors in the memory system 300. However, the memory system is not limited to comprise only six memory units. Word line driving circuits 310 and 320, respectively, transmit word line signals WL1 and WL2 to corresponding memory unit rows, as shown in FIG. 3. The word line signals WLB1 and WLB2 are respectively generated by the inverters 331 and 332 and transmitted to the source power supply circuit 200. The source power supply circuit 200 can provide the source voltage SL to two different columns of the memory unit.

Figure 4:
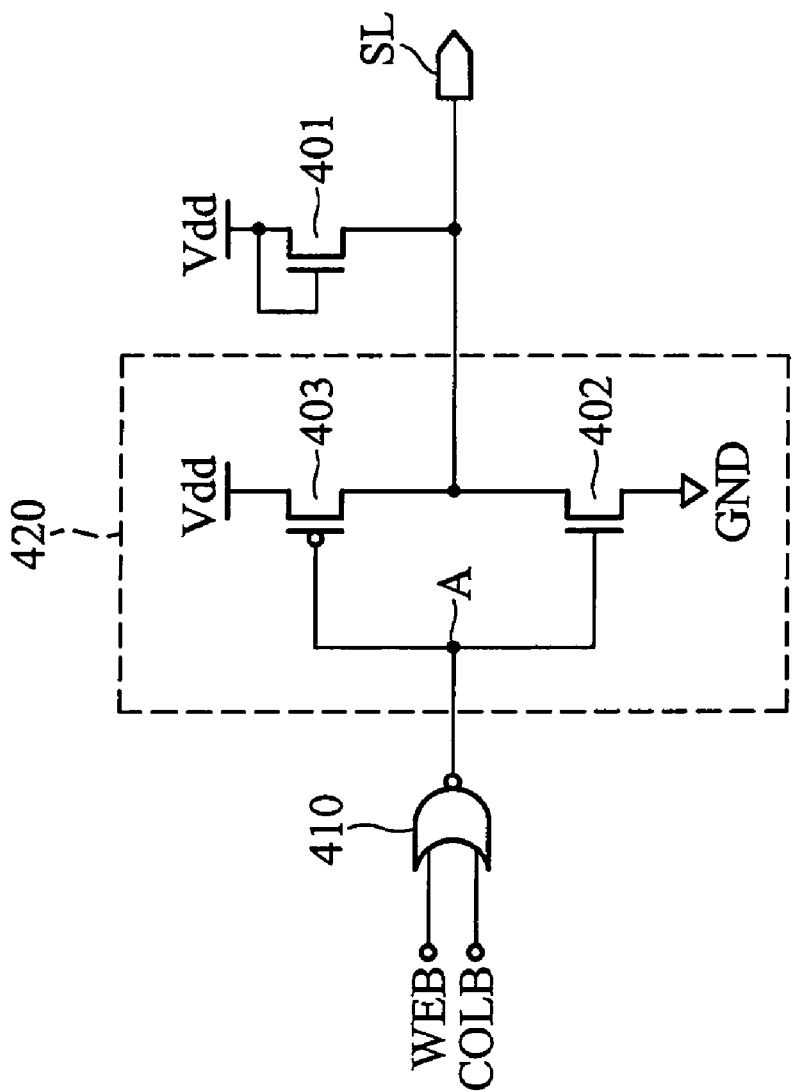
FIG. 4 shows a source power supply circuit according to another embodiment of the invention.

FIG. 4 shows a source power supply circuit 400 according to another embodiment of the invention. The source power supply circuit 400 can provide different source voltages SL to the memory unit 110. When the memory unit 110 is in the writing status, the source power supply circuit 400 can provide voltage $V_{dd}$-$V_{TN}$. Thus, the transistor 103 of the memory unit 110 can be turned on completely to avoid the writing error. When the memory unit 110 is in the reading status, the source power supply circuit 400 can provide voltage $V_{dd}$ and the memory unit 110 can be read correctly by using the NMOS transistor 101 and the bit line BL.

The source power supply circuit 400 determines the voltage levels of a point A and the source voltage SL according to the voltage levels of a write enable signal WEB and a bit line column control signal COLB. When the memory unit 110 is in the writing status, the point A is at high voltage level and the source voltage SL is voltage $V_{dd}$-$V_{TN}$. When the memory unit 110 is in the reading status, the point A is at low voltage level and the source voltage SL is voltage $V_{dd}$, as shown in Table 2.

TABLE 2

|  | COLB | WEB | A | SL |
|---|---|---|---|---|
| Read | X | 1 | GND | $V_{dd}$ |
| Write | 0 | 0 | $V_{dd}$ | $V_{dd}$-$V_{TN}$ |

The source power supply circuit 400 comprises a control circuit (NOR gate) 410, a CMOS inverter 420 and an NMOS transistor 401. The control circuit 410 determines the voltage levels of the point A and the source voltage SL according to the voltage levels of the write enable signal WEB and the bit line column control signal COLB. Thus, the memory 110 can receive a lower voltage power to avoid the writing error in the writing status. When the voltage levels of the write enable signal WEB and the bit line column control signal are at low voltage levels (logic 0), the memory unit 110 is in the writing status. When the voltage level of the write enable signal WEB is at a high voltage level (logic 1), the memory unit 110 is in the reading status.

Figure 5:
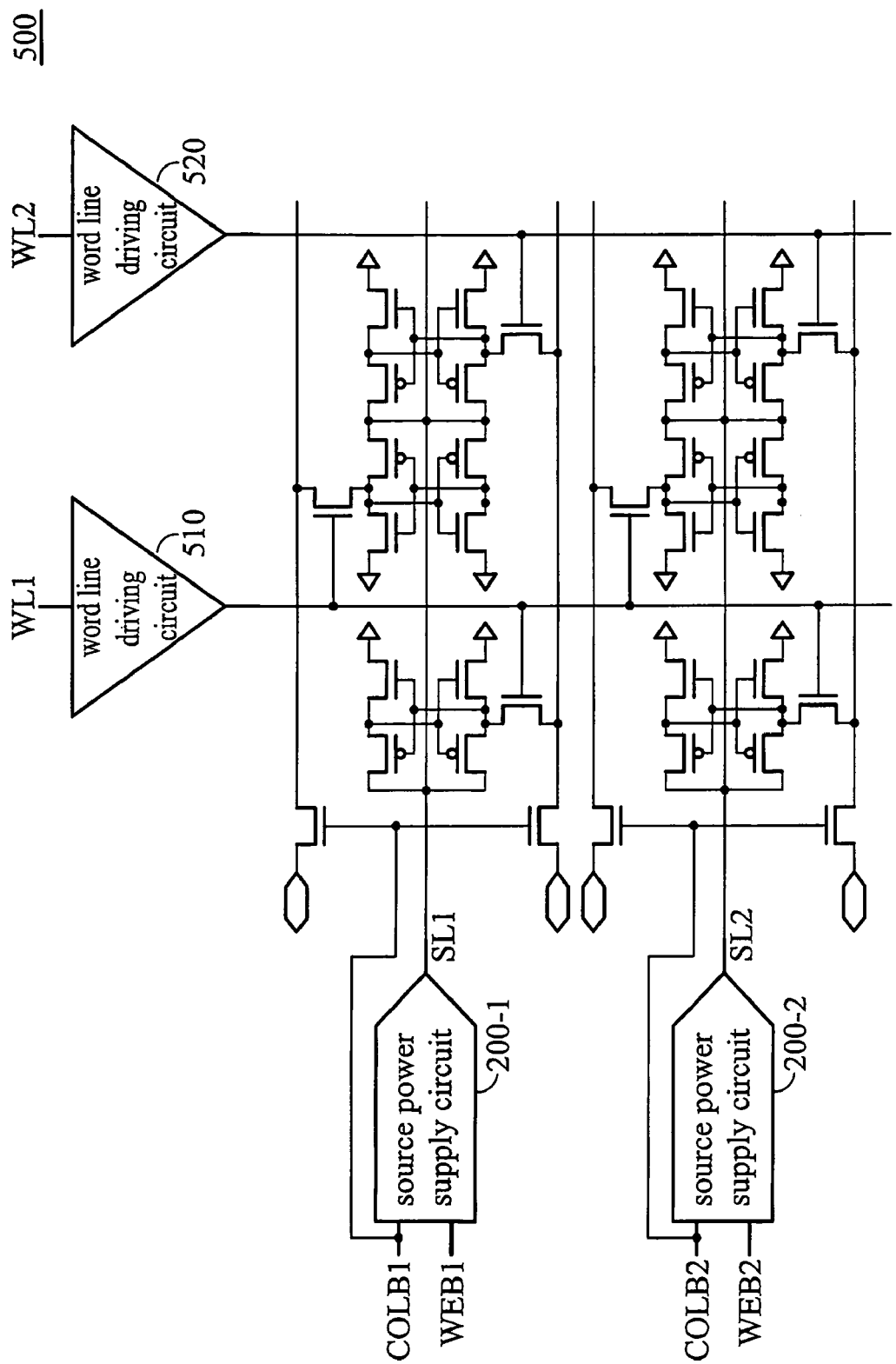
FIG. 5 shows a layout diagram of a memory system according to another embodiment of the invention.

FIG. 5 shows a layout diagram of a memory system 500 according to another embodiment of the invention. FIG. 5 only shows six memory units in the memory system 500. However, the memory system 500 is not limited to comprise only six transistors. Word line driving circuits 510 and 520, respectively, transmit word line signals WL1 and WL2 to corresponding memory unit columns, as shown in FIG. 5. The bit line column control signals COLB1 and COLB2 are respectively transmitted to the source power supply circuits 200-1 and 200-2. The source power supply circuits 200-1 and 200-2, respectively, provide the source voltages SL1 and SL2 to different memory unit rows.

With regard to the memory systems of FIGS. 3 and 5, since the length of the memory system 300 in the Y direction is shorter, the memory system 300 can be used for specific applications. Because the size of the memory system 500 is smaller, using the memory system 500 of the invention can reduce layout size and cost.

While the invention has been described by way of example and in terms of preferred embodiment, it is to be understood that the invention is not limited to thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A memory system, comprising
   at least one memory unit coupled between a source voltage and a ground voltage and accessing digital data by using a word line signal and a bit line signal; and
   a source power supply circuit providing the source voltage to the memory unit, wherein when the memory unit is in a reading status, the source voltage is a first power voltage and when the memory unit is in a writing status, the source voltage is a second power voltage, and wherein the second power voltage is the first power voltage subtracted by a specific voltage to avoid a writing error when the memory unit is rewriting the digital data.

2. The memory system as claimed in claim 1, wherein the source power supply circuit from a driving circuit output terminal outputs the source voltage, and the source power supply circuit comprises:
   a control circuit outputting a low voltage signal from an output terminal when the memory unit is in the reading status, or outputting a high voltage signal from the output terminal when the memory unit is in the writing status;
   an inverter coupled to the output terminal of the control circuit and coupled between the first power voltage and the ground voltage, and outputting the first power voltage to the driving circuit output terminal when the control circuit outputs the low voltage signal; and
   a first NMOS transistor comprising a first source coupled to the first power voltage, a first drain coupled to the first power voltage and the first source and a first drain coupled to the driving circuit output terminal, wherein when the control signal outputs the high voltage signal, the first NMOS transistor outputs the second power voltage to the driving circuit output terminal.

3. The memory system as claimed in claim 2, wherein the control circuit determines to output the high voltage signal or the low voltage signal to the driving circuit output terminal according to a write enable signal and at least one word line signal.

4. The memory system as claimed in claim 2, wherein the control circuit determines to output the high voltage signal or the low voltage signal to the driving circuit output terminal according to a write enable signal and at least one bit line column control signal, and wherein the bit line column control signal is corresponding to the bit line signal.

5. The memory system as claimed in claim 4, wherein the control signal is an NOR gate and outputs the high voltage signal or the low voltage signal according to voltage levels of the write enable signal and the bit line column control signal.

6. The memory system as claimed in claim 2, wherein the specific voltage is a threshold voltage of the first NMOS transistor.

7. The memory system as claimed in claim 2, wherein the inverter comprises:
a second NMOS transistor comprising a second source coupled to the driving circuit output terminal, a second drain coupled to the ground voltage and a second gate coupled to the output terminal of the control circuit; and
a PMOS transistor comprising a third source coupled to the driving circuit output terminal, a third drain coupled to the first power voltage and a third gate coupled to the output terminal of the control circuit.

8. The memory system as claimed in claim 1, wherein the memory unit is a static random access memory (SRAM) with five transistors.

9. The memory system as claimed in claim 1, wherein the memory unit comprises:
a latch circuit comprising a first inverter and a second inverter, storing the digital data and using an output terminal to access the digital data, wherein the first inverter and the second inverter is coupled cross over; and
a switch turned on according to a voltage level of the word line signal to transmit the bit line signal to the latch circuit for accessing the digital data.

10. The memory system as claimed in claim 1, further comprising a word line driving circuit, wherein the word line driving circuit, the memory unit and the source power supply circuit are disposed along an X direction to reduce length of the memory system in a Y direction.

11. A memory system, comprising:
at least one memory unit coupled between a source voltage and a ground voltage and accessing digital data by using a word line signal and a bit line signal; and
a source power supply circuit providing the source voltage to the memory unit, wherein when the memory unit is in a reading status, the source voltage is a first power voltage and when the memory unit is in a writing status, the source voltage is a second power voltage, wherein the second power voltage equals to the first power voltage subtracted by a specific voltage to avoid a writing error when the memory unit is rewriting the digital data, and wherein the source power supply circuit from a driving circuit output terminal outputs the source voltage, and the source power supply circuit comprises:
a control circuit outputting a low voltage signal from an output terminal when the memory unit is in the reading status, or outputting a high voltage signal from the output terminal when the memory unit is in the writing status;
an inverter coupled to the output terminal of the control circuit and coupled between the first power voltage and the ground voltage, and outputting the first power voltage to the driving circuit output terminal when the control circuit outputting the low voltage signal; and
a first NMOS transistor comprising a first source coupled to the first power voltage, a first drain coupled to the first power voltage and the first source and a first drain coupled to the driving circuit output terminal, wherein when the control signal outputs the high voltage signal, the first NMOS transistor outputs the second power voltage to the driving circuit output terminal,
wherein the control circuit determines to output the high voltage signal or the low voltage signal to the driving circuit output terminal according to a write enable signal and at least one word line signal.

12. A memory system, comprising:
at least one memory unit coupled between a source voltage and a ground voltage and accessing digital data by using a word line signal and a bit line signal; and
a source power supply circuit providing the source voltage to the memory unit, wherein when the memory unit is in a reading status, the source voltage is a first power voltage and when the memory unit is in a writing status, the source voltage is a second power voltage, wherein the second power voltage equals to the first power voltage subtracted by a specific voltage to avoid a writing error when the memory unit is rewriting the digital data, and wherein the source power supply circuit from a driving circuit output terminal outputs the source voltage, and the source power supply circuit comprises:
a control circuit outputting a low voltage signal from an output terminal when the memory unit is in the reading status, or outputting a high voltage signal from the output terminal when the memory unit is in the writing status;
an inverter coupled to the output terminal of the control circuit and coupled between the first power voltage and the ground voltage, and outputting the first power voltage to the driving circuit output terminal when the control circuit outputting the low voltage signal; and
a first NMOS transistor comprising a first source coupled to the first power voltage, a first drain coupled to the first power voltage and the first source and a first drain coupled to the driving circuit output terminal, wherein when the control signal outputs the high voltage signal, the first NMOS transistor outputs the second power voltage to the driving circuit output terminal,
wherein the control circuit determines to output the high voltage signal or the low voltage signal to the driving circuit output terminal according to a write enable signal and at least one bit line column control signal.

* * * * *